(12) United States Patent
Matsuoka et al.

(10) Patent No.: US 11,029,371 B2
(45) Date of Patent: Jun. 8, 2021

(54) TRIAXIAL MAGNETISM DETECTING APPARATUS AND SATELLITE

(71) Applicant: CANON DENSHI KABUSHIKI KAISHA, Chichibu (JP)

(72) Inventors: Takahiro Matsuoka, Hanno (JP); Takumi Sato, Fukaya (JP); Masahiro Kawase, Higashimatsuyama (JP)

(73) Assignee: Canon Denshi Kabushiki Kaisha, Chichibu (JP)

( * ) Notice: Subject to any disclaimer, the term of this patent is extended or adjusted under 35 U.S.C. 154(b) by 15 days.

(21) Appl. No.: 16/713,192

(22) Filed: Dec. 13, 2019

(65) Prior Publication Data

US 2020/0116802 A1    Apr. 16, 2020

Related U.S. Application Data

(63) Continuation of application No. PCT/JP2017/043374, filed on Dec. 1, 2017.

(30) Foreign Application Priority Data

Jun. 15, 2017    (JP) .............................. JP2017-117863

(51) Int. Cl.
  *G01R 33/02*    (2006.01)
  *G01R 33/04*    (2006.01)
  (Continued)

(52) U.S. Cl.
  CPC ....... *G01R 33/0206* (2013.01); *G01R 15/188* (2013.01); *G01R 33/022* (2013.01);
  (Continued)

(58) Field of Classification Search
  CPC .............. G01R 33/0283; G01R 33/022; G01R 33/0358; G01R 33/10; G01R 33/3628;
  (Continued)

(56) References Cited

U.S. PATENT DOCUMENTS

| 5,278,497 A | 1/1994 | Ariyoshi |
| 6,456,068 B1 | 9/2002 | Kawase ..................... 324/249 |

(Continued)

FOREIGN PATENT DOCUMENTS

| CN | 200941115 Y | 8/2007 |
| EP | 1 770 406 A1 | 4/2007 |

(Continued)

OTHER PUBLICATIONS

International Search Report & Written Opinion in International Patent Application No. PCT/JP2017/043374, dated Feb. 27, 2018.

(Continued)

*Primary Examiner* — Raul J Rios Russo
(74) *Attorney, Agent, or Firm* — Venable LLP

(57) ABSTRACT

The present invention provides a triaxial magnetism detecting apparatus having a high mechanical strength and being compact in size by simplifying the arrangement configuration of magnetism detectors for the reduction of the number of components and allowing easy angular adjustment of the magnetism detectors and easy installation of the magnetism detectors on the apparatus body, and a satellite. A triaxial magnetism detecting apparatus has a power supply board, a circuit board, and a magnetism detecting unit, which are fixed on a body, and the circuit board and the magnetism detecting unit are horizontally connected. By using the magnetism detecting unit, the triaxial magnetism detecting apparatus detects magnitudes of magnetic fields in mutually perpendicular X-axis, Y-axis, and Z-axis directions.

14 Claims, 12 Drawing Sheets

(51) Int. Cl.

| | |
|---|---|
| *G01R 33/028* | (2006.01) |
| *G01R 33/022* | (2006.01) |
| *G01R 33/035* | (2006.01) |
| *G01R 33/10* | (2006.01) |
| *G01R 33/36* | (2006.01) |
| *G01R 15/18* | (2006.01) |
| *G01C 17/30* | (2006.01) |
| *G01C 17/00* | (2006.01) |

(52) U.S. Cl.
CPC ..... *G01R 33/0283* (2013.01); *G01R 33/0358* (2013.01); *G01R 33/04* (2013.01); *G01R 33/10* (2013.01); *G01R 33/3628* (2013.01); *G01C 17/00* (2013.01); *G01C 17/30* (2013.01)

(58) Field of Classification Search
CPC .. G01R 15/188; G01R 33/0206; G01R 33/04; G01R 33/0047; G01C 17/30; G01C 17/00
See application file for complete search history.

(56) References Cited

U.S. PATENT DOCUMENTS

| | | | |
|---|---|---|---|
| 6,642,705 B2 | 11/2003 | Kawase | .................... 324/117 R |
| 6,897,649 B2 | 5/2005 | Kawase | ........................ 324/249 |
| 6,989,666 B2 | 1/2006 | Kawase | .................... 324/117 R |
| 9,651,583 B2 | 5/2017 | Kawase | ............. H01R 13/6683 |
| 9,746,497 B2 | 8/2017 | Kawase | ................. G01R 33/02 |
| 2005/0017714 A1* | 1/2005 | Beichler | ............... G01R 33/04 |
| | | | 324/247 |
| 2005/0122101 A1 | 6/2005 | Bohlinger et al. | |
| 2013/0147474 A1* | 6/2013 | Nakajima | ........... G01R 15/207 |
| | | | 324/253 |
| 2013/0162246 A1* | 6/2013 | Nakajima | ........... G01R 15/207 |
| | | | 324/252 |
| 2017/0059668 A1 | 3/2017 | Chang et al. | |

FOREIGN PATENT DOCUMENTS

| | | |
|---|---|---|
| EP | 1 839 064 A | 10/2007 |
| EP | 2 553 066 A2 | 12/2012 |
| JP | H04-78582 A | 3/1992 |
| JP | 2006-214776 A | 8/2006 |
| JP | 5639846 B2 | 12/2014 |
| JP | 2016-217864 A | 12/2016 |
| KR | 2011-0012178 A | 2/2011 |

OTHER PUBLICATIONS

Feb. 3, 2021 Extended Search Report in European Patent Application No. 17 913 599.1.

* cited by examiner

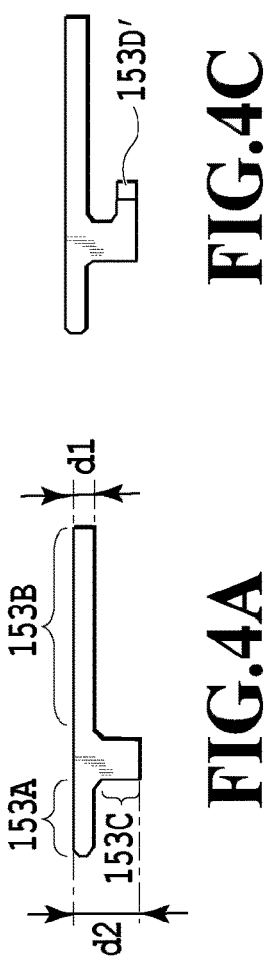
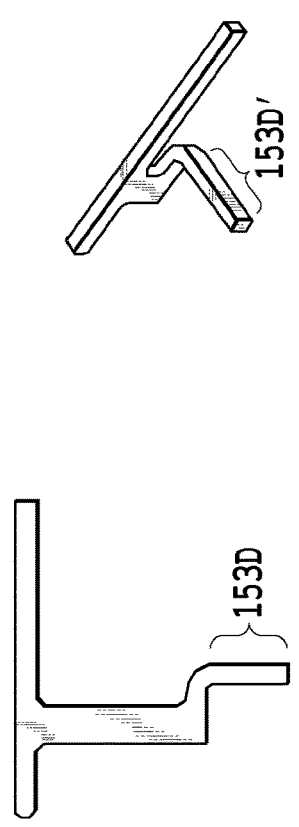
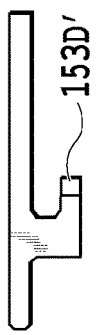
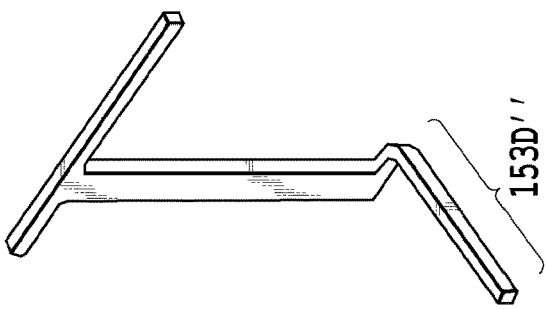

MOVE ON XY STAGE OF MICROSCOPE

TRIAXIAL MAGNETISM DETECTING APPARATUS AND SATELLITE

CROSS-REFERENCE TO RELATED APPLICATIONS

This application is a Continuation of International Patent Application No. PCT/JP2017/043374, filed Dec. 1, 2017, which claims the benefit of Japanese Patent Application No. 2017-117863, filed Jun. 15, 2017, both of which are hereby incorporated by reference herein in their entirety.

BACKGROUND OF THE INVENTION

Field of the Invention

The present invention relates to a triaxial magnetism detecting apparatus that detects the strengths of magnetic fields along three mutually perpendicular axes, and a satellite having the same.

Background Art

A magnetism detecting apparatus for mutually perpendicular three axes is configured by combining magnetism detectors that respectively detect magnetic field components along X, Y, and Z axes. For the magnetism detector, a Hall element, a parallel fluxgate sensor, and the like are often used.

Since the Hall element is available at relatively low cost and easy to downsize, it is used for many applications such as digital cameras and mobile phones. Meanwhile, the fluxgate type magnetism detector has a high degree of detection sensitivity and can perform detection with a high resolution. Therefore, the fluxgate type magnetism detector is used for attitude control such as satellites and aircraft that require higher precision. The parallel fluxgate type magnetism detector is driven by an electric current passing through an excitation coil which is wound around a ring-shaped magnetic core.

In using the Hall element and the parallel fluxgate type magnetism detector, an orientation direction in magnetic field sensing cannot be clearly confirmed from their appearance. For this reason, in adjusting perpendicularity in the X-, Y-, and Z-axis magnetic field sensing directions, it is needed to adjust arrangement angles while checking an output voltage in a state where a uniform magnetic field strength is applied by a Helmholtz coil or the like. PTL 1 discloses adjusting the positions of magnetism detectors for three axes while turning them on a block for fixing the parallel fluxgate type magnetism detector to adjust the perpendicularity of the axes.

PATENT LITERATURE

PTL 1: Japanese Patent No. 5639846
PTL 2: Japanese Utility Model Laid-Open No. H04-78582

SUMMARY OF THE INVENTION

However, in the triaxial magnetism detecting apparatus, the magnetism detectors for three axes need to be individually installed on an apparatus body while performing angular adjustment in a state where a uniform magnetic field strength is applied, resulting in a problem of a number of complicated steps including adjustment and installation. Moreover, since mechanism components are required for the angular adjustment for each magnetism detector, the size and mass of the apparatus increase. Furthermore, a problem also arises that a connection portion of a terminal pin that electrically connects the magnetism detector and a circuit board is susceptible to impact and vibration applied to the apparatus.

The present invention has been made to solve the above problems. The present invention can provide a triaxial magnetism detecting apparatus having a high mechanical strength and being compact in size by integrating the arrangement configuration of magnetism detectors to reduce the number of components directly installed on the apparatus body and allowing easy angular adjustment of the magnetism detectors and easy installation of the magnetism detectors on the apparatus body, and a satellite.

To solve the above problems, according to the present invention, there is provided a triaxial magnetism detecting apparatus performing triaxial magnetism detection for mutually perpendicular X, Y, and Z axes, the apparatus including: a body; a retaining member formed of a non-magnetic material, the retaining member being fixed on the body; a magnetism detector detecting a magnitude of a magnetic field component along one of X, Y, and Z axes, the magnetism detectors being fixed respectively on side faces of the retaining member that are perpendicular to a face being in contact with the body; and a circuit board to which an output signal of the magnetism detector is transmitted, the circuit board being fixed on the body, wherein the retaining member and the circuit board are separated from each other, and a terminal pin that electrically connects the magnetism detector and the circuit board is fixed to the retaining member between the magnetism detector and the circuit board.

According to another aspect of the present invention, a shape of the retaining member is a rectangular parallelepiped.

According to another aspect of the present invention, at least part of the retaining member is located inside a cutout or a hole provided on the circuit board.

According to another aspect of the present invention, the circuit board includes a first board having a drive unit and a signal processing unit of the magnetism detector and a second board having a power unit electrically connected to the first board, and the second board is arranged between the first board and the body.

According to another aspect of the present invention, the circuit board is fixed to the body to face an upper face of the retaining member.

According to another aspect of the present invention, the retaining member is arranged between the circuit board and the body.

According to another aspect of the present invention, an intermediate member fixed to the retaining member is further included, wherein the terminal pin is fixed to the intermediate member.

According to another aspect of the present invention, the terminal pin includes an engagement portion fixed to a recess formed on the side face of the retaining member by fitting, a first connection portion fixed to the circuit board, a positioning portion provided on a lower portion of the engagement portion to come into contact with the retaining member, and a second connection portion fixed to the magnetism detector, and a width of the positioning portion in a direction where the terminal pin is inserted to or extracted from the retaining member is greater than a width of the first connection portion in the direction where the terminal pin is inserted to or extracted from the retaining member.

According to another aspect of the present invention, the positioning portion comes into contact with a groove portion provided on the retaining member.

According to another aspect of the present invention, the terminal pin has a shock absorption structure between the magnetism detector and the circuit board.

According to another aspect of the present invention, the shock absorption structure is a structure in which the terminal pin bends in a substantially U shape.

According to another aspect of the present invention, the magnetism detector includes a magnetic body in line segment form for passing an alternating current and a sensing coil wound around the magnetic body.

According to another aspect of the present invention, the retaining member has a coil groove portion in which the sensing coil of the magnetism detector is arranged.

According to another aspect of the present invention, there is provided a satellite having a triaxial magnetism detecting apparatus, the apparatus including: a body; a retaining member formed of a non-magnetic material, the retaining member being fixed on the body; a magnetism detector detecting a magnitude of a magnetic field component along one of X, Y, and Z axes, the magnetism detectors being fixed respectively on side faces of the retaining member that are perpendicular to a face being in contact with the body; and a circuit board to which an output signal of the magnetism detector is transmitted, the circuit board being fixed on the body, wherein the retaining member and the circuit board are separated from each other, and a terminal pin that electrically connects the magnetism detector and the circuit board is fixed to the retaining member between the magnetism detector and the circuit board.

The present invention allows easy adjustment work since the magnetism detectors for three axes that detect the magnetic field components along X, Y, and Z axes are fixed on one retaining member, and angular adjustment of the three magnetism detectors can be performed separately from the installation of the magnetism detectors on the apparatus body. Furthermore, since the terminal pin connecting the magnetism detector and the circuit board is configured such that impact and vibration from the circuit board are not easily transmitted to the connection portion to the magnetism detector, the present invention can have a high impact resistance.

BRIEF DESCRIPTION OF THE DRAWINGS

FIG. 4A is a side view of a terminal pin to be connected to a sensing coil of a magnetism detector;

FIG. 4B is a side view of a terminal pin to be connected to a magnetic body of a magnetism detector for the X-axis and a magnetic body of a magnetism detector for the Y-axis;

FIG. 4C is a side view of a terminal pin to be connected to an upper end of a magnetic body of a magnetism detector for the Z-axis;

FIG. 4D is a perspective view of a terminal pin to be connected to an upper end of a magnetic body of a magnetism detector for the Z-axis;

FIG. 4E is a side view of a terminal pin to be connected to a lower end of a magnetic body of a magnetism detector for the Z-axis;

FIG. 4F is a perspective view of a terminal pin to be connected to a lower end of a magnetic body of a magnetism detector for the Z-axis;

DESCRIPTION OF THE EMBODIMENTS

Now, embodiments of the present invention will be described in detail.

First Embodiment

Figure 1A:
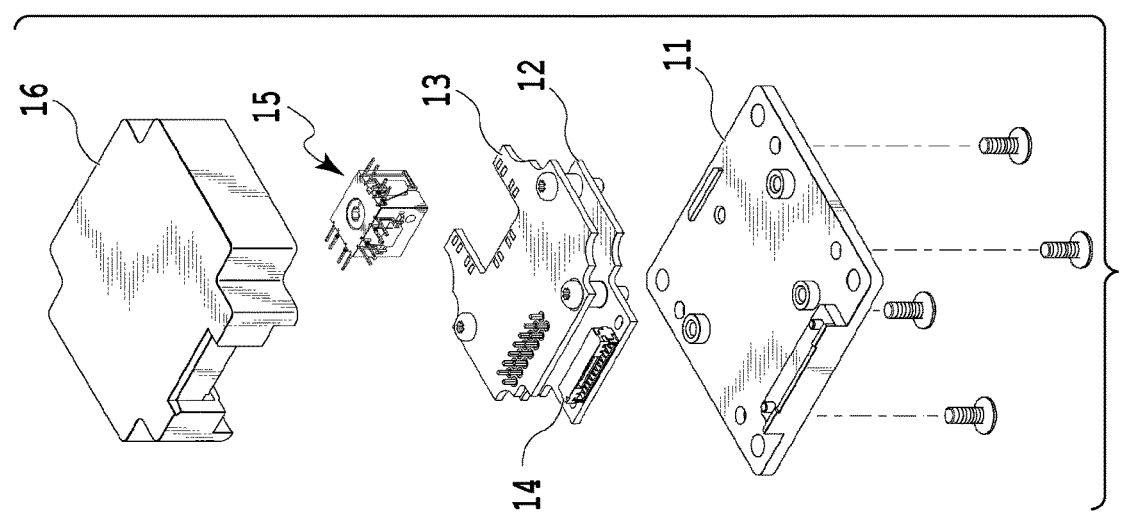
FIG. 1A is an exploded perspective view of a triaxial magnetism detecting apparatus according to a first embodiment of the present invention.
Figure 1B:
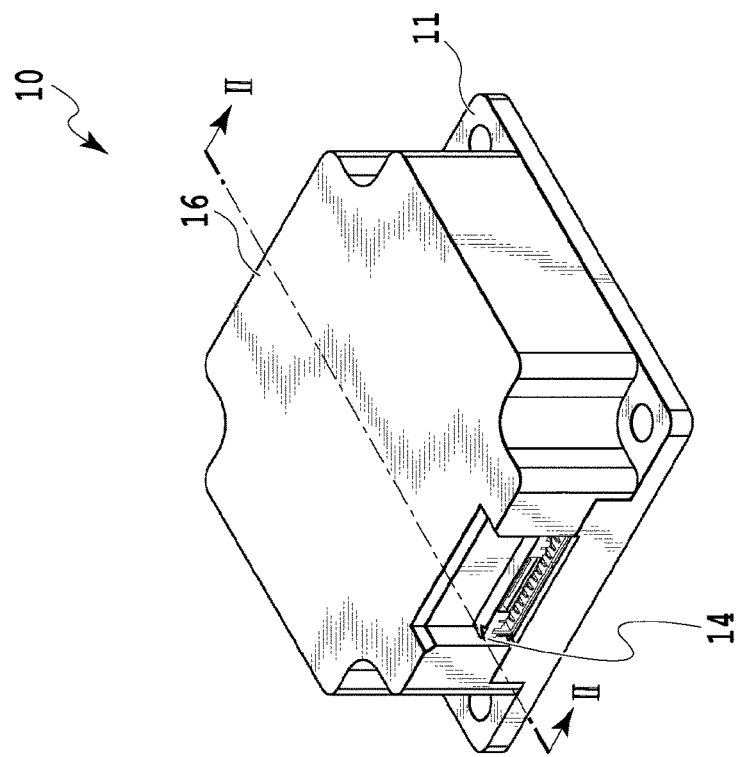
FIG. 1B is an assembled perspective view of the triaxial magnetism detecting apparatus according to the first embodiment of the present invention.
Figure 2:
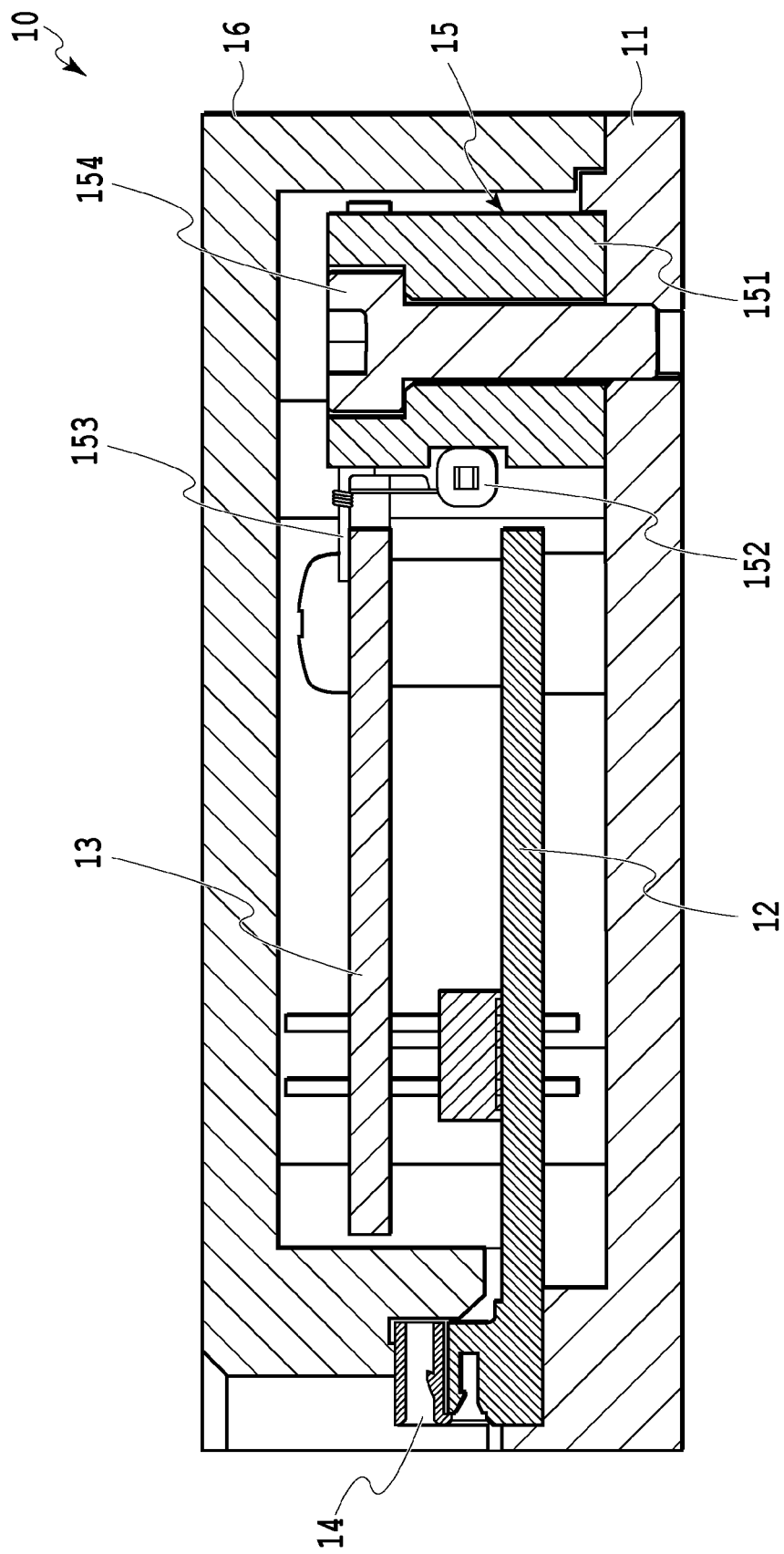
FIG. 2 is a cross-sectional view of the triaxial magnetism detecting apparatus according to the first embodiment of the present invention.

FIG. 1A and FIG. 1B are respectively an exploded perspective view and an assembled perspective view of a triaxial magnetism detecting apparatus 10 according to the first embodiment of the present invention. FIG. 2 is a cross-sectional view (a cross section taken along II-II in FIG. 1B) of the triaxial magnetism detecting apparatus 10 according to the first embodiment of the present invention. In the triaxial magnetism detecting apparatus 10 of the present embodiment, a power supply board 12, a circuit board 13, and a magnetism detecting unit 15 are fixed to a body 11; the circuit board 13 and the magnetism detecting unit 15 are horizontally connected; and a cover 16 is fixed to the body 11 by a screw to cover the components. By using the magnetism detecting unit 15, the triaxial magnetism detecting apparatus 10 detects the magnitudes of magnetic fields in the mutually perpendicular X-axis, Y-axis, and Z-axis directions and outputs detection results from a connector 14. The detection results obtained by the triaxial magnetism detecting apparatus 10 can be used for, for example, attitude control of an apparatus having the triaxial magnetism detecting apparatus 10 mounted thereon and detection of change in magnetic field strength.

The power supply board 12 and the circuit board 13 are arranged substantially in parallel in this order as viewed from the body 11, and are fixed to the body 11 by a screw via a spacer or the like such that the position of the circuit board 13 from the body 11 is not above the height of the magnetism detecting unit 15 fixed to the body 11. The power supply board 12 has a power unit configured to create a predetermined power to be supplied to the circuit board 13, and the circuit board 13 has a drive unit and a signal processing unit for a magnetism detector 152. A retaining member 151 of the magnetism detecting unit 15 is arranged inside a cutout or a hole provided for the circuit board 13 via a cavity, and the circuit board 13 and the magnetism detecting unit 15 are horizontally connected. Incidentally, a cutout or a hole may be provided also for the power supply board 12, and the retaining member 151 may be arranged inside thereof.

As shown in FIG. 2, the circuit board 13 is arranged in a lateral direction of the retaining member 151 with a predetermined distance, and the power supply board 12 is arranged below the circuit board 13 so as not to come into contact with the retaining member 151 and the magnetism detector 152. The height of the retaining member 151 is determined based on the height of the magnetism detector 152, particularly depending on a magnetism detector 152-3 for detecting magnetism along the Z-axis which requires the greatest height. As will be described later, an orthogonal fluxgate sensor is used for the magnetism detector 152 in the present embodiment. Since a straight line shape is required to some extent, the retaining member 151 also needs to have a certain height.

In a case where the magnetism detector 152 is fixed by using the retaining member 151 as described above, since a terminal pin 153 extends to a top face portion of the retaining member 151, it is preferable to align the circuit board 13 with the top face portion of the retaining member 151 so that the height of the triaxial magnetism detecting apparatus 10 is suppressed and the length of the terminal pin 153 is not excessively extended. By providing the power supply board 12 in the thus produced space between the circuit board 13 and the body 11, it is possible to reduce the area of the circuit board 13 and allow downsizing of the triaxial magnetism detecting apparatus 10.

Furthermore, by providing the connector 14 on an end portion of the power supply board 12 opposite to the retaining member 151, it is possible to effectively use the space.

Figure 3A:
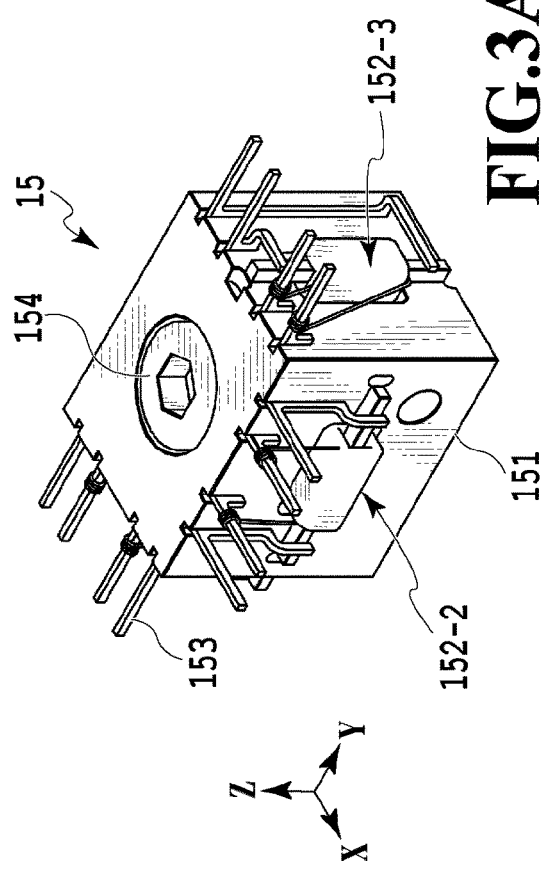
FIG. 3A is a perspective view of a magnetism detecting unit.
Figure 3D:
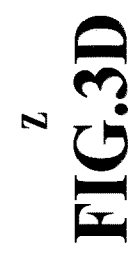
FIG. 3D is a view showing a side face of a magnetism detecting unit having installed thereon a magnetism detector that detects magnetism in one of mutually perpendicular X-axis, Y-axis, and Z-axis directions.
Figure 3C:
FIG. 3C is a view showing a side face of a magnetism detecting unit having installed thereon a magnetism detector that detects magnetism in one of mutually perpendicular X-axis, Y-axis, and Z-axis directions.
Figure 3B:
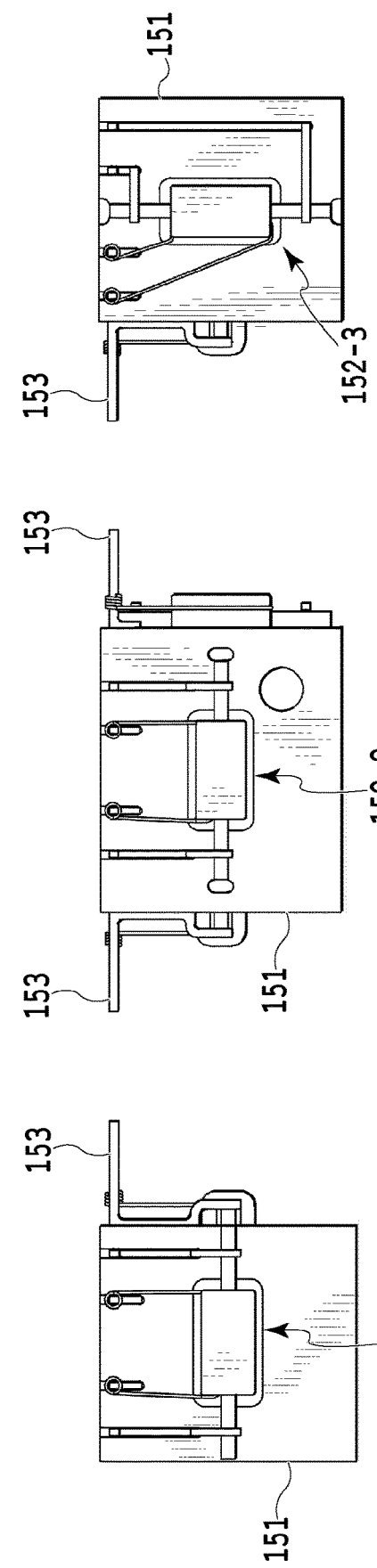
FIG. 3B is a view showing a side face of a magnetism detecting unit having installed thereon a magnetism detector that detects magnetism in one of mutually perpendicular X-axis, Y-axis, and Z-axis directions.

FIG. 3A to FIG. 3D show configurations of the magnetism detecting unit 15 of the triaxial magnetism detecting apparatus 10 according to the first embodiment of the present invention. FIG. 3A is a perspective view of the magnetism detecting unit 15. FIG. 3B to FIG. 3D are views respectively showing side faces of the magnetism detecting unit 15 having installed thereon magnetism detectors 152-1 to 152-3 that detect magnetism in the mutually perpendicular X-axis, Y-axis, and Z-axis directions.

The magnetism detecting unit 15 includes the retaining member 151 fixed on the body 11 by a screw 154, the magnetism detectors 152-1 to 152-3 respectively fixed on three faces of the retaining member 151 that are perpendicular to the face being in contact with the body 11, and the conductive terminal pin 153 that connects the magnetism detector 152 and the circuit board 13. Incidentally, as shown in FIG. 3D, two lead wires, which are connected to a sensing coil 152B arranged around the magnetism detector 152-3 detecting magnetism along the Z-axis, adjacently extend to the left side in FIG. 3D, and the two terminal pins 153 of the magnetism detector 152-3 extend to the right side in FIG. 3D. The above-described arrangement allows improving the workability of the process of winding the lead wires extended from the sensing coil 152B on the terminal pins 153 shown in FIG. 4A.

The retaining member 151 is made of a non-magnetic material in a rectangular parallelepiped, and three faces of the retaining member 151, to which the magnetism detectors 152-1 to 152-3 are fixed, cross their adjacent faces at right angles. It should be noted as long as the retaining member 151 has any shape with three faces perpendicular to each other, the retaining member 151 may be a polyhedron such as a right triangular pyramid or a right triangular prism, other than the rectangular parallelepiped. Furthermore, the retaining member 151 has a groove portion for arranging the sensing coil 152B on respective faces on which the magnetism detectors 152-1 to 152-3 are fixed. The groove portion may be used for positioning the sensing coil 152B or may be used for fixing the sensing coil 152B. The retaining member 151 may further have a groove portion that engages a positioning portion 153C of the terminal pin 153 to position or lock the terminal pin 153.

FIG. 4A to FIG. 4F show configurations of the terminal pin 153 provided for the magnetism detecting unit 15. FIG. 4A is a side view of the terminal pin to be connected to the sensing coil of the magnetism detector 152. FIG. 4B is a side view of the terminal pin to be connected to the magnetic body of the magnetism detector 152 for the X-axis and the magnetic body of the magnetism detector 152 for the Y-axis. FIG. 4C is a side view of the terminal pin to be connected to an upper end of the magnetic body of the magnetism detector 152 for the Z-axis. FIG. 4D is a perspective view thereof. FIG. 4E is a side view of the terminal pin to be connected to a lower end of the magnetic body of the magnetism detector 152 for the Z-axis. FIG. 4F is a perspective view thereof. It should be noted that description of an engagement portion 153A, a first connection portion 153B, and a positioning portion 153C, which will be described later, is omitted in the description of FIG. 4B to FIG. 4F since they are common among FIG. 4A to FIG. 4F.

The terminal pin 153 is made of a non-magnetic conductive material, in a substantially T shape, and is fixed on the face of the retaining member 151 on which the magnetism detector 152 is fixed. The terminal pin 153 includes the engagement portion 153A which is fixed to a recess of the retaining member 151 by fitting or the like, the first connection portion 153B which extends from the retaining member 151 and is horizontally connected to the circuit board 13, the positioning portion 153C which crosses the engagement portion 153A and the first connection portion 153B at right angles and is fixed to the retaining member 151, and a second connection portion 153D-153D" which is connected to the magnetism detector 152. In the present embodiment, as will be described later, the positioning portion 153C has a bottom face that comes into contact with the groove portion provided on the retaining member 151 in a direction perpendicular to an insertion-extraction direction of the terminal pin 153 to come into contact with the retaining member 151. In addition, it is preferable to have a structure that when the engagement portion 153A is inserted into the retaining member 151, part of the positioning portion 153C is similarly inserted into the retaining member 151 to be engaged. In the present embodiment, with respect to the retaining member 151, the bottom face and the top face of the positioning portion 153C come into contact with the retaining member 151. Note that the terminal pin 153 may be press-fitted into the retaining member 151.

Figure 5B:
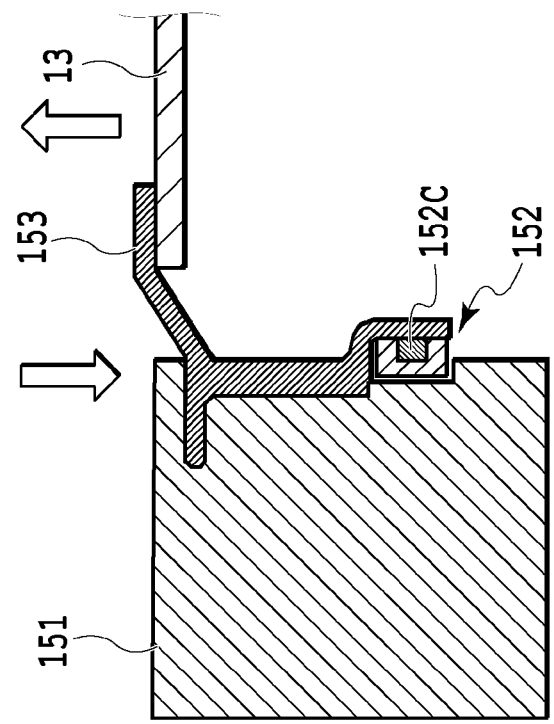
FIG. 5B is a view showing deformation of a terminal pin in a case where strong impact or vibration is applied to a triaxial magnetism detecting apparatus.
Figure 5A:
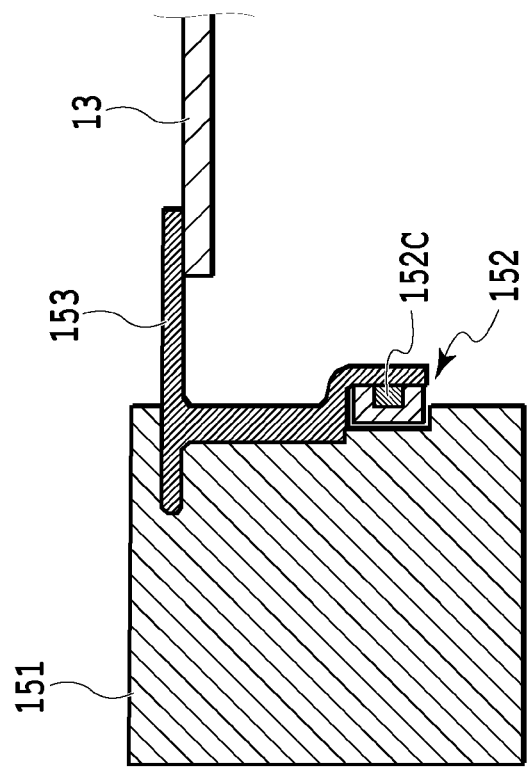
FIG. 5A is a view showing deformation of a terminal pin in a case where strong impact or vibration is applied to a triaxial magnetism detecting apparatus.

FIG. 5A and FIG. 5B show deformation of the terminal pin 153 in a case where strong impact or vibration is applied to the triaxial magnetism detecting apparatus 10. In a case where impact is applied to the triaxial magnetism detecting apparatus 10 from the outside, the relative positional relationship between the circuit board 13 and the retaining member 151 changes. As shown in FIG. 5A, for example, before the impact is applied, the retaining member 151 and the circuit board 13 are fixed to a position where the terminal pin 153 is free from stress. However, in a case where the impact is applied from the outside, as shown in FIG. 5B, the circuit board 13 and the retaining member 151 may be displaced from each other in opposite directions. In this case, since the circuit board 13 causes displacement of the first connection portion 153B from the retaining member 151, the vicinity of the base of the first connection portion 153B of the terminal pin 153 acts as a fulcrum, whereby the vicinity of a coupling portion between the engagement portion 153A and the positioning portion 153C bends according to the principle of the lever, and a force is created to rotate the positioning portion 153C in a direction separating from the retaining member 151. If the positioning portion 153C rotates in the direction separating from the retaining member 151, the positional relationship between the second connection portion 153D and the magnetism detector 152 changes, whereby stress is applied on a connection portion (electrode 152C) between the second connection portion 153D and the magnetism detector 152, and troubles may occur in the magnetism detector 152.

Accordingly, in the present embodiment, to suppress the displacement of the positioning portion 153C from the magnetism detector 152, the terminal pin 153 is formed such that a width d2 of the positioning portion 153C in the insertion-extraction direction of the terminal pin 153 is greater than a width d1 of the first connection portion 153B in the insertion-extraction direction of the terminal pin 153 (d2>d1). Since rigidity of the positioning portion 153C fixed to the retaining member 151 is greater than that of the first connection portion 153B, the vicinity of the coupling portion between the first connection portion 153B and the positioning portion 153C acts as a fulcrum, and the vicinity of the coupling portion between the first connection portion 153B and the positioning portion 153C tends to bend. Accordingly, stress caused by the force created due to the change in the positional relationship between the circuit board 13 and the retaining member 151 is absorbed by the bending of the vicinity of the coupling portion between the first connection portion 153B and the positioning portion 153C. This can greatly reduce the stress applied on the connection portion between the second connection portion 153D and the magnetism detector 152.

It should be noted that in a case where the positioning portion 153C is fixed to one of the faces of the retaining member 151 by an adhesive or the like, the positioning portion 153C will no longer move relative to the retaining member 151, and it is possible to further reduce the stress applied on the connection portion between the second connection portion 153D and the magnetism detector 152.

As for the impact resistance, it is preferable that the cavity between the retaining member 151 and the circuit board 13 is larger. Providing a large cavity allows the first connection portion 153B to tend to bend at the vicinity of the coupling portion with the circuit board 13 and the vicinity of the boundary of the positioning portion 153C, and the terminal pin 153 can produce a greater effect of reducing the stress caused by the force created in the magnetism detector 152. Meanwhile, since the magnetism detector 152 receives and outputs from and to the circuit board 13 a signal having a high frequency at a few MHz or higher, it is advantageous for the accuracy in magnetic detection that the terminal pin 153 has a short signal line connecting the circuit board 13 and the magnetism detector 152 to lower the impedance. For this reason, the cavity between the retaining member 151 and the circuit board 13 preferably has a length of about a few millimeters.

Figure 6:
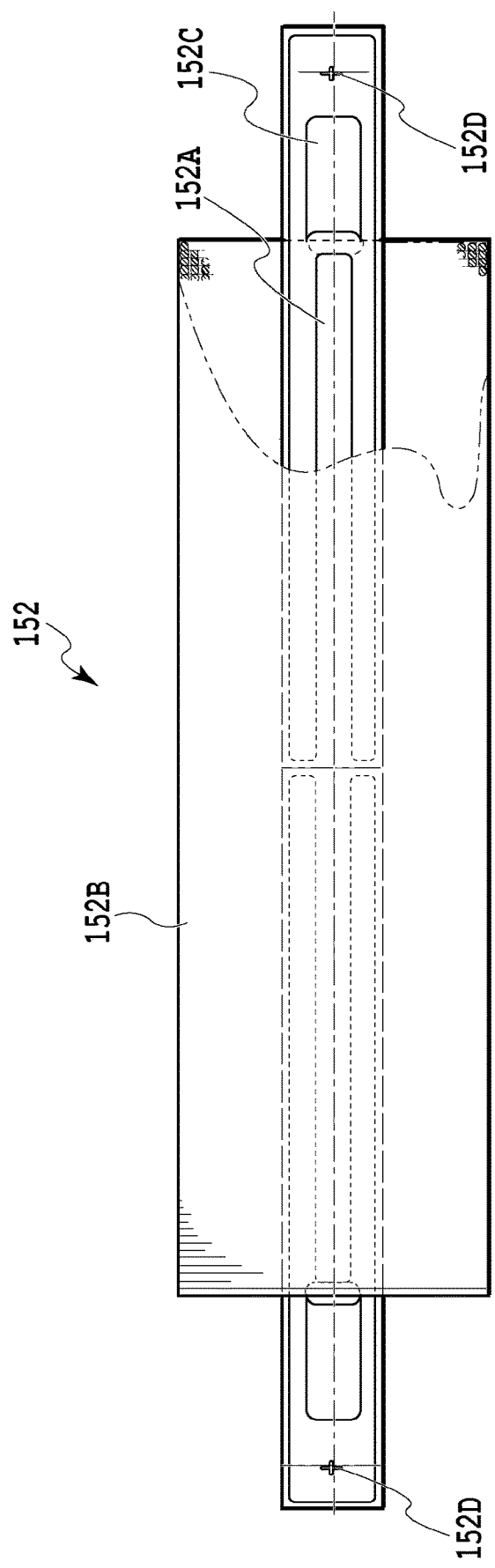
FIG. 6 is a view showing a configuration of an orthogonal fluxgate sensor as an example of the magnetism detector.

FIG. 6 shows a configuration of an orthogonal fluxgate sensor as an example of the magnetism detector 152. The orthogonal fluxgate sensor includes a magnetic body 152A in line segment form for passing a high-frequency current and the sensing coil 152B made of a coil wound around the magnetic body 152A, for detecting change in magnetic flux around the magnetic body 152A. The magnetic body 152A is in line segment form and may be a magnetic wire or a magnetic thin film formed on a non-magnetic material. The sensing coil 152B may also be an air core coil or a bobbin coil, as well as a thin film coil formed on a magnetic thin film via an insulating layer. On both sides of the magnetic body 152A, electrodes 152C electrically connected to the magnetic body 152A are formed, and on an extension of the line segment of the magnetic body 152A, a marker 152D indicating the position of the magnetic body 152A is formed. Incidentally, forming the magnetic body 152A and the marker 152D with the same mask allows the marker 152D to be formed in an accurate position.

Figure 7A:
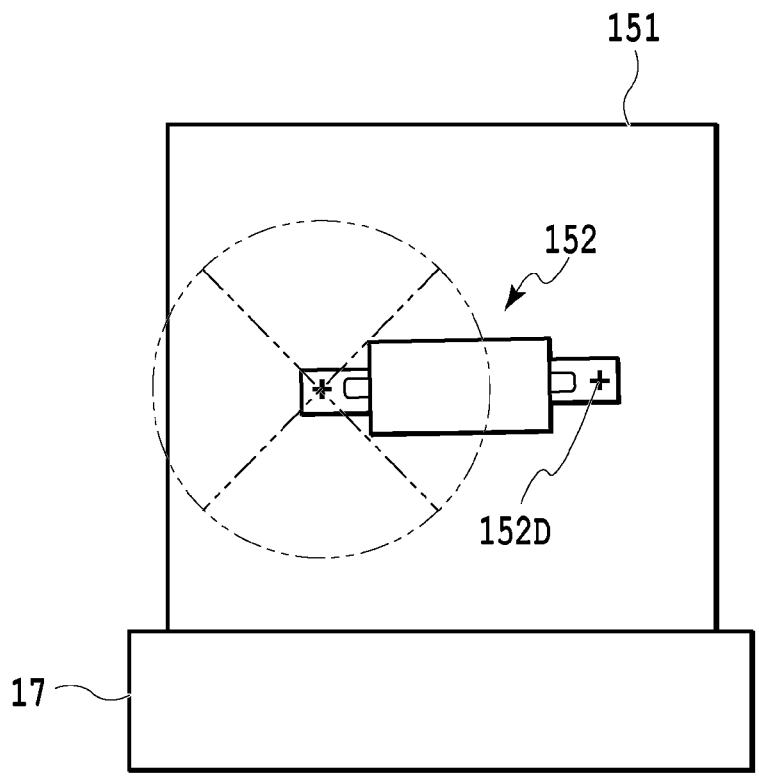
FIG. 7A is a view showing an angular adjustment method for an orthogonal fluxgate sensor.
Figure 7B:
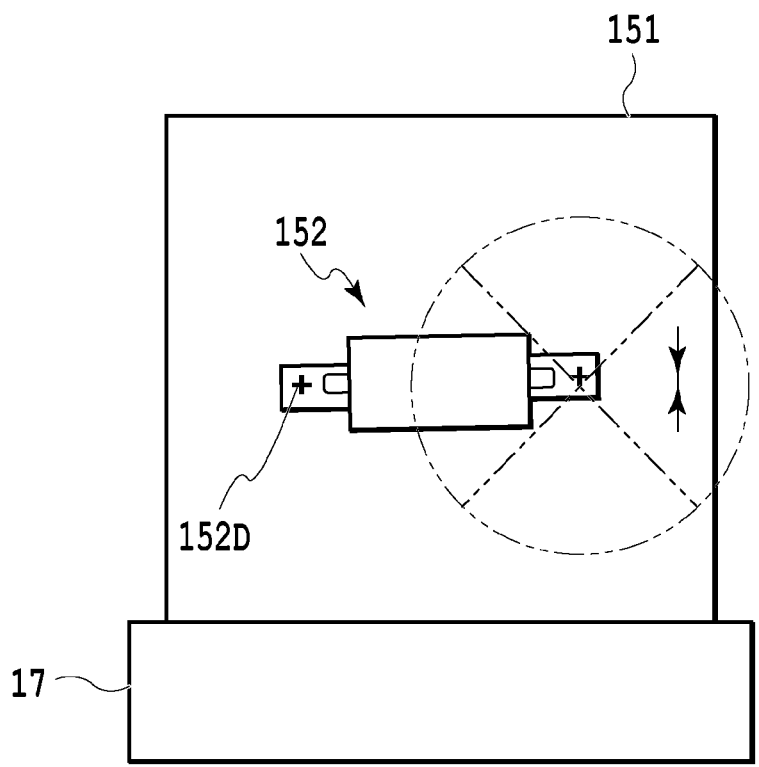
FIG. 7B is a view showing an angular adjustment method for an orthogonal fluxgate sensor.

Since an orientation direction of the orthogonal fluxgate sensor in magnetic field sensing is determined to be the longitudinal direction of the magnetic body 152A due to a diamagnetic field, it is possible to determine the orientation direction in magnetic field sensing from the marker 152D formed on the extension of the line segment of the magnetic body 152A. FIG. 7A and FIG. 7B show an angular adjustment method for the orthogonal fluxgate sensor. The retaining member 151 is arranged to come into contact with a reference face provided on a jig 17, and the magnetism detector 152 is placed on the retaining member 151. A reference indicator (e.g., a crosshair used in a microscope) provided on a microscope and one of the markers 152D of the magnetism detector 152 are aligned with each other for temporary fixing (FIG. 7A); a stage having the retaining member 151 and the jig 17 placed thereon is moved simultaneously with the reference face of the jig 17; and the position of the magnetism detector 152 is adjusted so that the other one of the markers 152D is aligned with the reference indicator (FIG. 7B). This method allows adjustment of the direction of magnetic field sensing from the appearance of the magnetism detector 152 without applying a uniform magnetic field strength. This orthogonal fluxgate sensor is compact and lightweight among other fluxgate sensors and can provide the magnetism detector 152 having a high degree of sensitivity with excellent perpendicularity of three axes.

It should be noted that the magnetism detector 152 is not limited to the orthogonal fluxgate sensor, but may be a Hall element, an MR element, a parallel fluxgate sensor, and the like.

The triaxial magnetism detecting apparatus 10 according to the present embodiment achieves downsizing of the apparatus in the following manner: the arrangement height is suppressed by arranging the magnetism detecting unit 15 inside a cutout or a hole provided for the circuit board 13 and horizontally connecting the circuit board 13 and the magnetism detecting unit 15; and the arrangement area is reduced by dividing the board into the power supply board 12 and the circuit board 13 and stacking the power supply board 12 and the circuit board 13. Furthermore, by employing the above structure, it is possible to have a mechanical strength to withstand the use under an environment in which strong vibration or impact is applied.

Second Embodiment

Figure 8B:
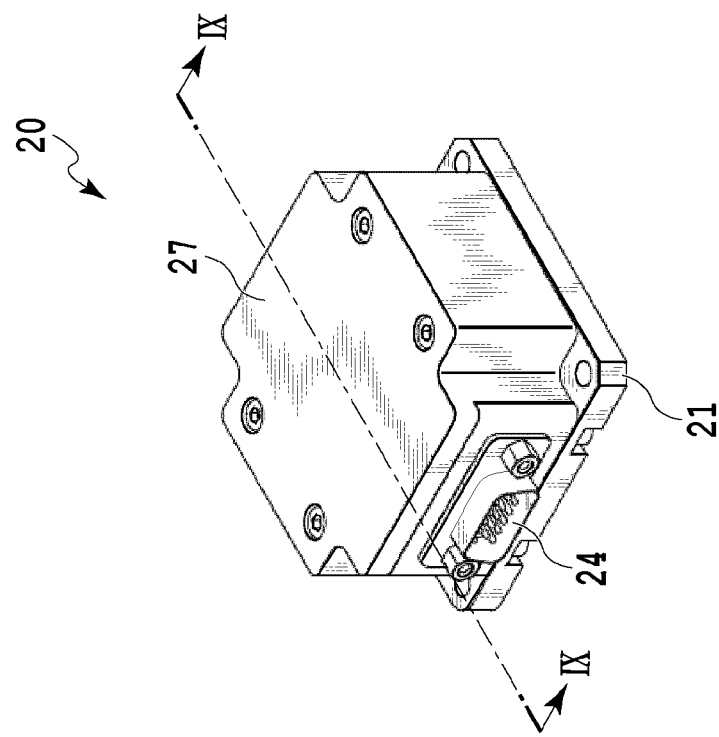
FIG. 8B is an assembled perspective view of the triaxial magnetism detecting apparatus according to the second embodiment of the present invention.
Figure 8A:
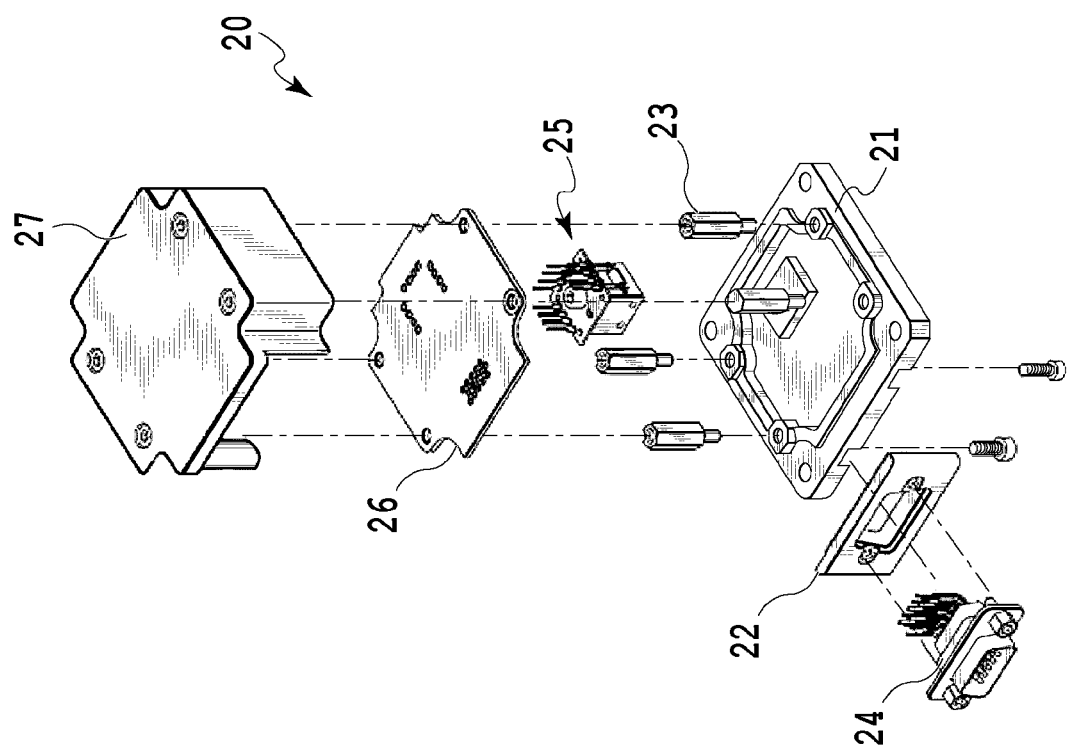
FIG. 8A is an exploded perspective view of a triaxial magnetism detecting apparatus according to a second embodiment of the present invention.
Figure 9:
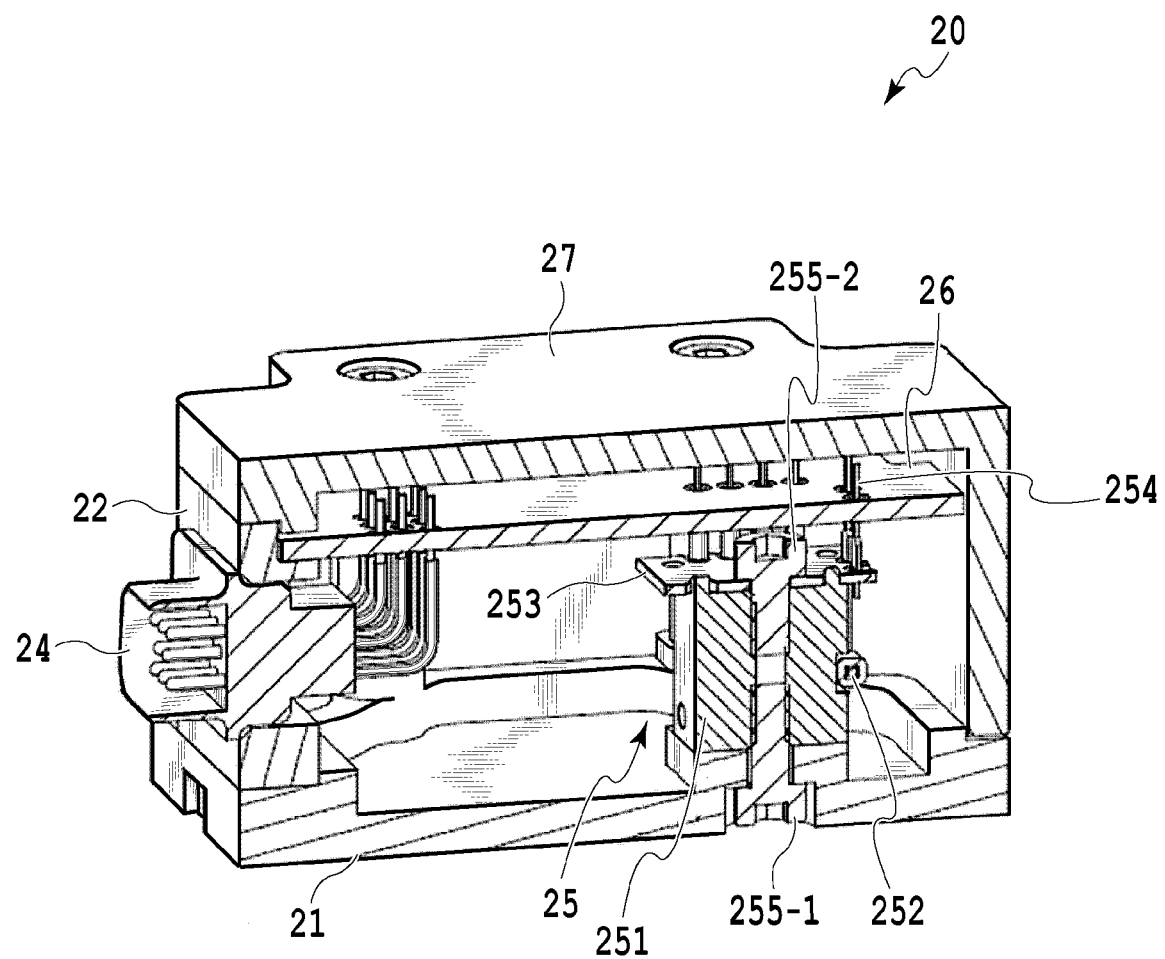
FIG. 9 is a perspective cross-sectional view of the triaxial magnetism detecting apparatus according to the second embodiment of the present invention.

FIG. 8A and FIG. 8B are respectively an exploded perspective view and an assembled perspective view of a triaxial magnetism detecting apparatus 20 according to the second embodiment of the present invention. FIG. 9 is a perspective cross-sectional view taken along IX-IX in FIG. 8B of the triaxial magnetism detecting apparatus 20 according to the second embodiment of the present invention. The second embodiment is characterized by the configuration that a magnetism detecting unit 25 is arranged between a body 21 and a circuit board 26 and stress caused by a force from the circuit board 26 is absorbed by an intermediate member 253.

In the triaxial magnetism detecting apparatus 20 of the present embodiment, the magnetism detecting unit 25 and the circuit board 26 are fixed to the body 21; the magnetism detecting unit 25 is vertically connected to the circuit board 26; and a cover 27 is fixed to the body 21 by a screw to cover the components. By using the magnetism detecting unit 25, the triaxial magnetism detecting apparatus 20 detects the magnitudes of magnetic fields in the mutually perpendicular X-axis, Y-axis, and Z-axis directions and outputs detection results from a connector 24. Incidentally, the circuit board 26 of the present embodiment corresponds to a component into which the power supply board 12 and the circuit board 13 of the first embodiment are integrated, and has a power unit, and a drive unit and a signal processing unit of a magnetism detector 252.

The magnetism detecting unit 25 has a retaining member 251, a magnetism detector 252, an intermediate member 253, and a terminal pin 254, and is fixed to the body 21 by a screw 255-2. The circuit board 26 is arranged so that the magnetism detecting unit 25 is located between the circuit board 26 and the body 21, and is fixed to the body 21 via a spacer 23 so that the retaining member 251 and the intermediate member 253 of the magnetism detecting unit 25 do not come into contact with the circuit board 26. The spacer 23 may be part of the body 21 or may be a pillar separate from the body 21.

Figure 10A:
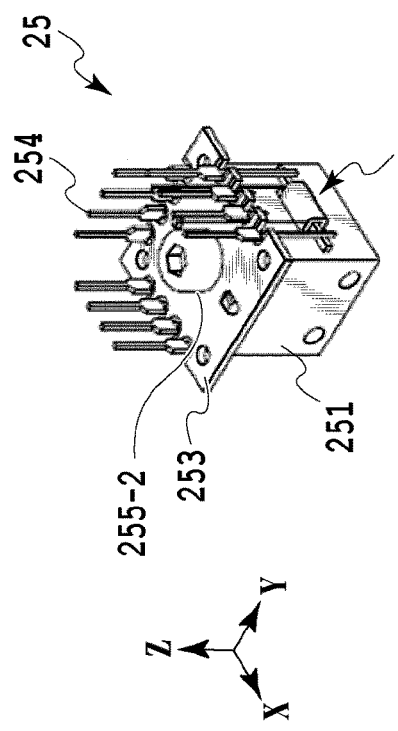
FIG. 10A is a perspective view of a magnetism detecting unit.
Figure 10D:
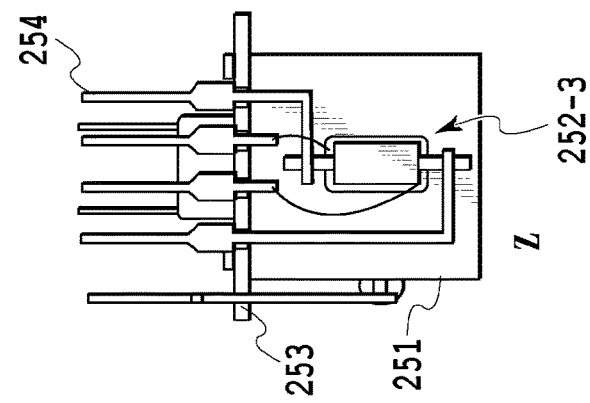
FIG. 10D is a view showing a side face of a magnetism detecting unit having installed thereon a magnetism detector that detects magnetism in one of mutually perpendicular X-axis, Y-axis, and Z-axis directions.
Figure 10C:
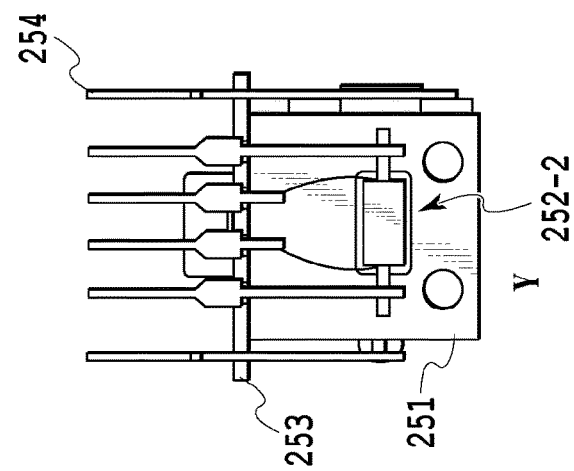
FIG. 10C is a view showing a side face of a magnetism detecting unit having installed thereon a magnetism detector that detects magnetism in one of mutually perpendicular X-axis, Y-axis, and Z-axis directions.
Figure 10B:
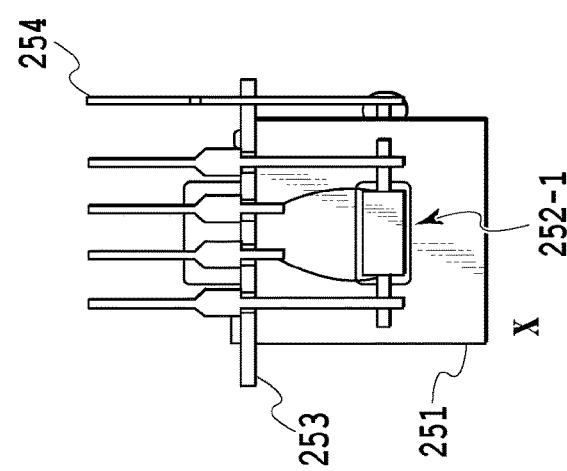
FIG. 10B is a view showing a side face of a magnetism detecting unit having installed thereon a magnetism detector that detects magnetism in one of mutually perpendicular X-axis, Y-axis, and Z-axis directions.

FIG. 10A to FIG. 10D show configurations of the magnetism detecting unit 25. FIG. 10A is a perspective view of the magnetism detecting unit 25. FIG. 10B to FIG. 10D are side views showing the respective side faces of the magnetism detecting unit 25 having installed thereon magnetism detectors 252-1 to 252-3 that detect magnetism in mutually perpendicular X-axis, Y-axis, and Z-axis directions.

The terminal pin 254 of the magnetism detecting unit 25 is used to electrically connect the circuit board 26 and the magnetism detector 252, and is fixed to the intermediate member 253 which is fixed to the retaining member 251 by a screw 255-1. A lower face of the intermediate member 253 and an upper face of the retaining member 251 may be in contact with each other or may be separated from each other via a spacer. The terminal pin 254 may be fixed to a through hole or a cutout of the intermediate member 253 by an adhesive, soldering, or the like. The terminal pin 254 has a wide portion that becomes wider adjacent to a portion to be fixed to the retaining member 251 or the intermediate member 253, so that an abutment on the intermediate member 253 is formed to make the fixing position clear and facilitate assembly.

The intermediate member 253 is located between the magnetism detector 252 and the circuit board 26, and is arranged so as not to come into close contact with the circuit board 26 via a space. The intermediate member 253 is made of a non-magnetic material such as resin or non-magnetic metal, and is fixed to the retaining member 251 by the screw 255-2.

The terminal pin 254 may also be fixed to an insertion portion provided on the retaining member 251 by fitting, an adhesive, soldering, or the like. The insertion portion provided on the retaining member 251 may have a substantially U shape or may be a through hole.

According to the present embodiment, in a case where impact, vibration, or the like is applied from the outside and the relative positional relationship between the magnetism detecting unit 25 and the circuit board 26 changes and a force is applied to the terminal pin 254, the force is absorbed by the intermediate member 253, and the stress caused by the force applied on the connection portion between the terminal pin 254 and the magnetism detector 252 can be greatly reduced.

Figure 11:
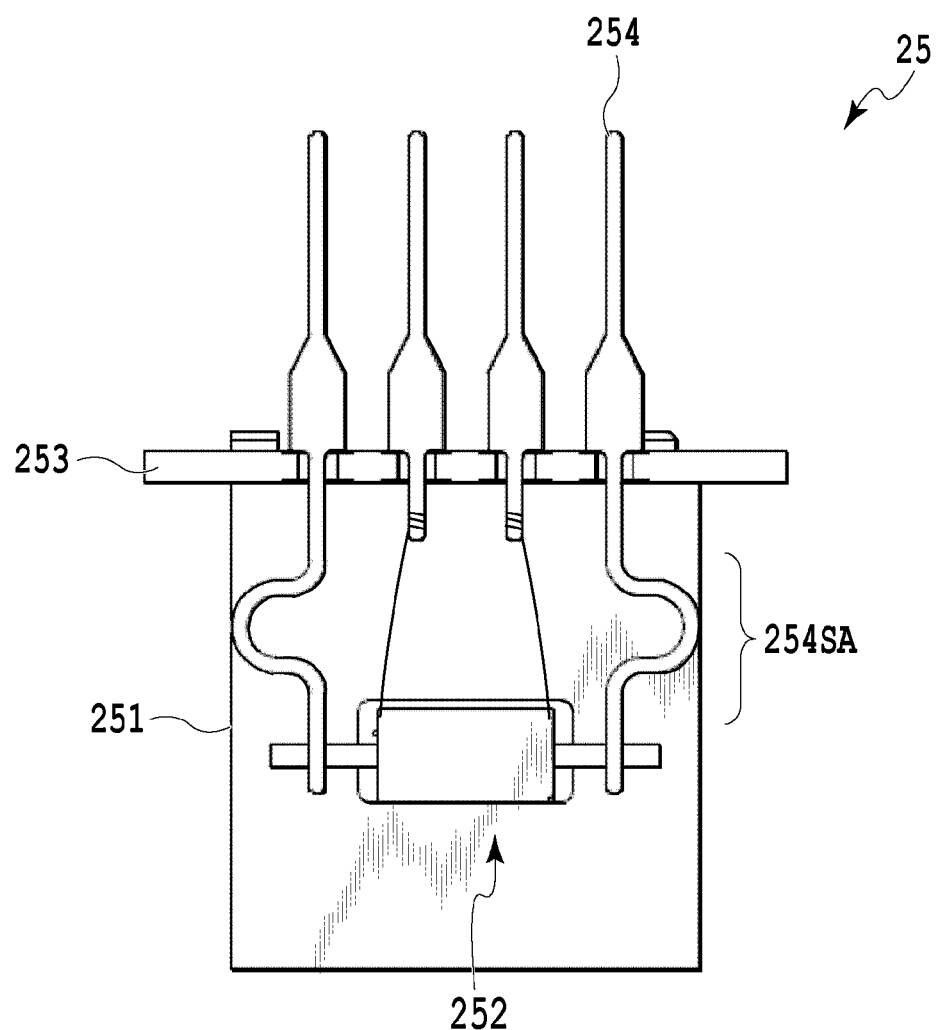
FIG. 11 is a view showing a shock absorption structure of a terminal pin according to the second embodiment of the present invention.

FIG. 11 shows a shock absorption structure 254SA of the terminal pin 254 according to the second embodiment of the present invention. The shock absorption structure 254SA is a substantially U-shaped structure having elasticity arranged between the magnetism detector 252 and the intermediate member 253. Other than the substantially U-shape structure shown in FIG. 11, the shock absorption structure 254SA may have, for example, a U-shape structure, a V-shaped structure, or an S-shaped structure combining two U shapes. By providing the shock absorption structure 254SA for the terminal pin 254, even in a case where impact, vibration, or the like is applied to the triaxial magnetism detecting apparatus 20 and the relative positional relationship between the magnetism detector 252 and the intermediate member 253 changes, thereby applying a force to the terminal pin 254, the terminal pin 254 can absorb the force, and the stress caused by the force applied on the connection portion between the magnetism detector 252 and the terminal pin 254 can be reduced.

As described above, the triaxial magnetism detecting apparatus according to the present invention has a high impact resistance, and can be preferably applied to an apparatus which particularly produces strong vibrations. For example, in a case where the triaxial magnetism detecting apparatus is installed on a satellite, particularly a space satellite, it is possible to ensure impact resistance to strong vibrations occurring at lift-off or the like.

Figure 12:
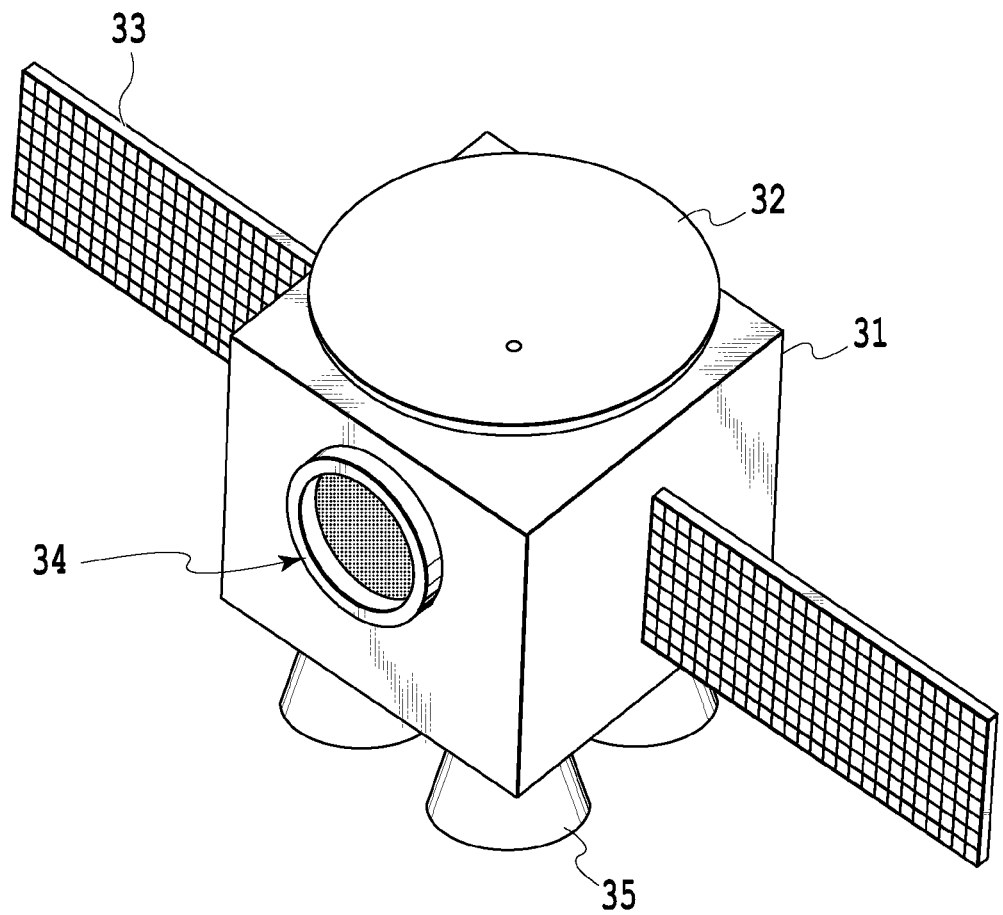
FIG. 12 is a perspective view showing a satellite to which a triaxial magnetism detecting apparatus according to the present invention is applied.

FIG. 12 shows a satellite as one of the examples of the satellite having the triaxial magnetism detecting apparatus according to the present invention mounted thereon. The satellite has a satellite body 31 on which a communication antenna 32, a solar panel 33, an optical system 34, a thruster 35, and the like are mounted.

As described above, in the triaxial magnetism detecting apparatus according to the present invention, the magnetism detector 152 is installed on the retaining member 151 such that the lower face of the retaining member 151 comes into contact with a reference face provided on the jig 17, and the magnetism detectors 152-1 to 152-3 are installed on the retaining member 151. In other words, the three magnetism detectors 152-1 to 152-3 are fixed such that the lower face of the retaining member 151 perpendicular to the faces having the three magnetism detectors 152-1 to 152-3 installed thereon serves as a reference face.

The triaxial magnetism detecting apparatus is mounted on the satellite (the satellite body 31 in this example) so that the reference face of the triaxial magnetism detecting apparatus matches the reference face of the satellite, whereby a detection angle of the triaxial magnetism detecting apparatus can be preferably maintained. The reference face of the satellite may match the reference face of other sensors mounted on the satellite.

Furthermore, the retaining member 151 having the magnetism detector 152 installed thereon is installed on the body 11, but the body 11 may also be a member forming the satellite, for example, a sensor installation member provided inside the satellite or a member forming one side face of the satellite.

REFERENCE SIGNS LIST

10, 20 triaxial magnetism detecting apparatus
11, 21 body
12 power supply board
13, 26 circuit board
14, 24 connector
15, 25 magnetism detecting unit
16, 27 cover
17 jig
22 connector fixing member
23 spacer
151, 251 retaining member
152, 252 magnetism detector
152A magnetic body
152B sensing coil
153C electrode
153D marker
153, 254 terminal pin
153A engagement portion
153B first connection portion
153C positioning portion
153D second connection portion
154, 255 screw
253 intermediate member
254SA shock absorption structure
31 satellite body
32 communication antenna
33 solar panel
34 optical system
35 thruster

What is claimed is:

1. A triaxial magnetism detecting apparatus performing triaxial magnetism detection for mutually perpendicular X, Y, and Z axes, the apparatus comprising:
   a body;
   a retaining member formed of a non-magnetic material, the retaining member being fixed on the body;
   a magnetism detector detecting a magnitude of a magnetic field component along one of X, Y, and Z axes, the magnetism detectors being fixed respectively on side faces of the retaining member that are perpendicular to a face being in contact with the body; and
   a circuit board to which an output signal of the magnetism detector is transmitted, the circuit board being fixed on the body,
   wherein the retaining member and the circuit board are separated from each other, and a terminal pin that electrically connects the magnetism detector and the circuit board is fixed to the retaining member between the magnetism detector and the circuit board.

2. The triaxial magnetism detecting apparatus according to claim 1, wherein a shape of the retaining member is a rectangular parallelepiped.

3. The triaxial magnetism detecting apparatus according to claim 1, wherein at least part of the retaining member is located inside a cutout or a hole provided on the circuit board.

4. The triaxial magnetism detecting apparatus according to claim 3, wherein the circuit board includes a first board having a drive unit and a signal processing unit of the magnetism detector and a second board having a power unit electrically connected to the first board, and
   wherein the second board is arranged between the first board and the body.

5. The triaxial magnetism detecting apparatus according to claim 1, wherein the circuit board is fixed to the body to face an upper face of the retaining member.

6. The triaxial magnetism detecting apparatus according to claim 5, wherein the retaining member is arranged between the circuit board and the body.

7. The triaxial magnetism detecting apparatus according to claim 6, further comprising an intermediate member fixed to the retaining member, wherein the terminal pin is fixed to the intermediate member.

8. The triaxial magnetism detecting apparatus according to claim 1, wherein the terminal pin includes an engagement portion fixed to a recess formed on the side face of the retaining member by fitting, a first connection portion fixed to the circuit board, a positioning portion provided on a lower portion of the engagement portion to come into contact with the retaining member, and a second connection portion fixed to the magnetism detector, and
   wherein a width of the positioning portion in a direction where the terminal pin is inserted to or extracted from the retaining member is larger than a width of the first connection portion in the direction where the terminal pin is inserted to or extracted from the retaining member.

9. The triaxial magnetism detecting apparatus according to claim 8, wherein the positioning portion comes into contact with a groove portion provided on the retaining member.

10. The triaxial magnetism detecting apparatus according to claim 1, wherein the terminal pin has a shock absorption structure between the magnetism detector and the circuit board.

11. The triaxial magnetism detecting apparatus according to claim 10, wherein the shock absorption structure is a structure in which the terminal pin bends in a substantially U shape.

12. The triaxial magnetism detecting apparatus according to claim 1, wherein the magnetism detector includes a magnetic body in line segment form for passing alternating current and a sensing coil wound around the magnetic body.

13. The triaxial magnetism detecting apparatus according to claim 12, wherein the retaining member has a coil groove portion in which the sensing coil of the magnetism detector is arranged.

14. A satellite having a triaxial magnetism detecting apparatus, the apparatus comprising:
a body;
a retaining member formed of a non-magnetic material, the retaining member being fixed on the body;
a magnetism detector detecting a magnitude of a magnetic field component along one of X, Y, and Z axes, the magnetism detectors being fixed respectively on side faces of the retaining member that are perpendicular to a face being in contact with the body; and
a circuit board to which an output signal of the magnetism detector is transmitted, the circuit board being fixed on the body,
wherein the retaining member and the circuit board are separated from each other, and a terminal pin that electrically connects the magnetism detector and the circuit board is fixed to the retaining member between the magnetism detector and the circuit board,
wherein a reference face of the triaxial magnetism detectors matches a reference face of the satellite.

* * * * *